United States Patent
Gudesen et al.

(10) Patent No.: US 6,787,825 B1
(45) Date of Patent: Sep. 7, 2004

(54) DATA STORAGE AND PROCESSING APPARATUS, AND METHOD FOR FABRICATING THE SAME

(75) Inventors: Hans Gude Gudesen, Brussels (BE); Per-Erik Nordal, Asker (NO); Geirr I. Leistad, Sandvika (NO); Johan Carlsson, Linköping (SE); Göran Gustafsson, Linköping (SE); Michael O Thompson, Ithaca, NY (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/463,906

(22) PCT Filed: Jun. 2, 1999

(86) PCT No.: PCT/NO99/00181

§ 371 (c)(1),
(2), (4) Date: Jan. 2, 2001

(87) PCT Pub. No.: WO99/63527

PCT Pub. Date: Dec. 9, 1999

(30) Foreign Application Priority Data

Jun. 2, 1998 (NO) .......................................... 19982518

(51) Int. Cl.[7] .............................................. H01L 29/80
(52) U.S. Cl. ................. 257/278; 257/390; 257/E27.026
(58) Field of Search ........................ 257/278, E27.026, 257/390, 779

(56) References Cited

U.S. PATENT DOCUMENTS 4,646,266 A * 2/1987 Ovshinsky et al. ......... 365/105
5,060,191 A * 10/1991 Nagasaki et al. ........... 365/145
5,432,729 A * 7/1995 Carson et al. ................ 365/63
5,612,228 A 3/1997 Shieh et al.
5,714,768 A 2/1998 Ovshinsky et al.
5,976,953 A * 11/1999 Zavracky et al. ........... 438/455

FOREIGN PATENT DOCUMENTS

WO 9509438 4/1995

OTHER PUBLICATIONS

Patent Abstracts Of Japan, abstract of JP A3–137896, Jun. 12, 1991.

* cited by examiner

Primary Examiner—David Nelms
Assistant Examiner—Tu-Tu Ho
(74) Attorney, Agent, or Firm—Birch, Stewart, Kolasch & Birch, LLP

(57) ABSTRACT

A data storage/processing apparatus includes ROM and/or WORM and/or REWRITEABLE memory modules and/or processing modules provided as a single main layer or multiple main layers on top of a substrate. Transistors and/or diodes operate the apparatus. In one set of embodiments, at least some of the transistors and/or diodes are provided on or in the substrate. In another set of embodiments, at least some of the layers on the top of the substrate include low-temperature compatible organic materials and/or low temperature compatible processes inorganic films, and the transistors and/or diodes need not be disposed on or in the substrate. In a related fabricating method, the memory and/or processing modules are provided on the substrate by depositing the layers in successive steps under thermal conditions that avoid subjecting an already-deposited, processed underlying layers to static or dynamic temperatures exceeding given stability limits, particularly with regard to organic materials.

49 Claims, 7 Drawing Sheets

DATA STORAGE AND PROCESSING APPARATUS, AND METHOD FOR FABRICATING THE SAME

This application is the national phase under 35 U.S.C. § 371 of PCT International Application No. PCT/NO99/00181 which has an International filing date of Jun. 2, 1999, which designated the United States of America.

The present invention concerns a data storage and data-processing apparatus, as well as a method for fabricating the same.

The invention particularly concerns a data storage and data-processing apparatus 3D scalable single- and multi-layer memory and data-processing modules and apparatus; and which even more particularly are based on ROM and/or WORM and/or REWRITABLE blocks addressed in a passive matrix scheme.

The present application claims priority from Norwegian Patent Application No. 982518 titled "Scalable integrated data-processing device", which has been assigned to the Assignee of the present invention and the disclosure of which is hereby additionally incorporated by reference. This scalable integrated data-processing device, particularly a microcomputer, comprises a processing unit with one or more processors and a storage unit with one or more memories. The data-processing device is provided on a carrier substrate and comprises mutually adjacent, substantially parallel layers stacked upon each other. The processing unit and the storage unit are each provided in one or more such layers and/or in layers formed with a selected number of processors and memories in selected combinations.

In each layer are provided horizontal electrical conducting structures which constitute internal electrical connections in the layer and besides each layer comprises further electrical conducting structures which provide electrical connections to other layers and to the exterior of the data processing device. These further electrical structures in a layer are provided on at least a side edge of the layer as electrical edge connections and/or preferably as vertical conducting structures which form an electrical connection in a cross-direction of the layer and perpendicular to its plane to contact electrical conducting structures in other layers.

In particular, the layers may be formed of a plurality of sublayers made of organic thin-film materials. Some of all layers or sublayers may also be made with organic or inorganic thin-film materials or both.

A preferred embodiment of the data-processing device according to the priority application is shown in FIG. 1. Advantageously are here processors and memories, the latter, e.g., RAMs assigned to the processors, provided in one and the same layer. A processor interface 3 with an I/O interface 8 is provided on a substrate S and above the processor interface 3 follows a processor layer $P_1$ with one or more processors. Both the processor interface 3 and the processor layer $P_1$ may as the lowermost layers in the data-processing device and adjacent to the substrate be realized in conventional, e.g., silicon-based technologies.

Above the processor layer $P_1$ is provided a first memory layer $M_1$ which may be configured with one or more RAMs 6 assigned to the processors 5 in the underlying processor layer $P_1$. In FIG. 1, however, the separate RAMs 6 in the memory layer $M_1$ are emphasized in particular. On the other hand it is shown how the memories in the memory layer $M_1$ may be directly connected to the underlying processor layer $P_1$ via buses 7, the stacked configuration allowing such buses 7 to be provided in a large number by being realized as vertical conducting structures, while the configuration layer-on-layer allows for a large number of such bus connections being provided between the processor layer $P_1$ and the memory layer $M_1$ and in addition with short signal paths. It will be realized that the juxtaposed arrangement in a surface would in contrast require longer connections and consequently longer transfer times.

Further, the data-processing device as shown comprises combined memory and processor layers $MP_1$, $MP_2$, $MP_3$ provided with processors that are connected mutually and to the processor interface 3 via the same processor bus 4. All the combines memory and processor layers MP comprises one or more processors 5 and one or more RAMs 6. Above the combined memory and processor layers MP there is provided a memory interface 1 with an I/O interface 9 to external units and above the memory interface 1 follows memory layers $M_2$, $M_3$, ... in as large number as desirable and possibly realized as the mass memory of the data-processing device. These memory layers, $M_2$, $M_3$, etc. are in their turn connected to the memory interface 1 via memory buses realized as vertical conducting structures 2 through the layers $M_2$, $M_3$, ....

The integrated data-processing device has a scalable architecture, such that, in principle, the device can be configured with an almost unlimited processor and memory capacity. In particular, the data-processing device can be implemented in various forms of scalable parallel architectures integrated with optimal interconnectivity in three dimensions.

In addition to comprising random accessible memories, the storage unit of the data-processing device can also comprise memories in the form of ROM, WORM or REWRITEABLE or combinations thereof.

The present invention particularly discloses how the three-dimensional scalable single- and multilayer memory and data-processing modules may be implemented with architectures and processing methods making them suitable for application in a scalable integrated data-processing device of the above-mentioned kind, but not necessarily limited thereto.

BACKGROUND OF THE INVENTION

Advanced DRAM demonstration dies are presently available in 1-gigabit (Gbit) modules based on a 0.18 $\mu$m process over a 570 mm$^2$ chip area. The conventional one-transistor DRAM cell requires roughly 10$\lambda^2$ area (where $\lambda$ is the minimum feature size) although processing "tricks" can reduce this significantly (40%). However row and column decode, drivers, sense amplifiers, and error correction logic cannot share the same silicon area and account for a significant fraction of the DRAM die area. More importantly, existing DRAM designs to date have not proven scalable to a 3D stacked architecture. By their design, high density DRAM's are also inappropriate as ROM memories. The conventional NOR-gate based ROM requires a nominal cell of 70$\lambda^2$ (though again reduced by processing tricks) limiting densities to <10$^8$ bits/cm$^2$ under even the most aggressive lithography assumptions. Higher densities can only be achieved through the use of both dense metal designs (minimum metal pitch) coupled with 3D integration. Technically and commercially viable devices of this type have as yet not been forthcoming, although the enormous commercial potential has prompted a great deal of R&D efforts by the electronics industry, which in term has spawned a voluminous patent literature.

3D Data Storage

Stacking of thin layers of memory on top of each other to achieve high volumetric and areal densities has been attempted by using e.g. lift-off techniques for inorganic thin film circuitry. However, the background art has led to designs that have proven too complicated or costly to have a commercial impact. In U.S. Pat. No. 5,375,085 "Three dimensional ferroelectric integrated circuit without insulation layer between memory layers", B. E. Gnade et al. have disclosed a layered, passively addressed memory stack based on a ferroelectric memory substance. However, no concrete information is given, in particular relating to processability in multiple levels, showing how complete memory devices can be made that include all the required ancillary active circuitry. Several patent applications involving stacking of thin film memory layers etc. and which are of relevance for the present invention, have been filed by the present applicant. These include Norwegian patent applications NO 973993, NO 980781, the above-mentioned NO 982518, NO 980602 and NO 990867.

Dense Metal Designs

Passive matrix addressing provides a density corresponding to a unit cell area of approximately $4\lambda^2$.

A number of patents exist where ROM devices employ passive matrix addressing schemes, e.g.: U.S. Pat. No. 4,099,260 of D. N. Lynes et al.: "Bipolar read-only-memory unit having self-isolating bit-lines"; U.S. Pat. No. 4,400,713 of K. G. Bauge and P. B. Mollier: "Matrix array of semiconducting elements"; U.S. Pat. No. 5,170,227 of M. Kaneko and K. Noguchi: "Mask ROM having monocrystalline silicon conductors"; U.S. Pat. No. 5,464,989 of S. Mori et al.: "Mask ROM using tunnel current detection to store data and a method of manufacturing thereof"; U.S. Pat. No. 5,811,337 by J. Wen: "Method of fabricating a semiconductor read-only memory device for permanent storage of multilevel coded data" and PCT Pat. WO 96/41381 of F. Gonzalez et al.: "A stack/trench diode for use with a multistate material in a non-volatile memory cell". However, such schemes rely explicitly on traditional silicon wafer processing, involving e.g. thermal treatment, implantation and etching procedures which are incompatible with the goals of the present invention, i.e.: low cost and optionally multilevel data storage.

The above-mentioned cited U.S. Pat. No. 5,375,085 discloses devices based on passive matrix addressing, but restricted to the special case of ferroelectric memory materials. The ferroelectric materials referred as examples in that patent have, however, proven unsuitable in simple passive matrix addressed memory schemes due to loss of polarization in unselected cells subjected to repeated partial switching. One- and two-transistor ferroelectric RAM (FERAM) devices avoid this problem, but have not lent themselves to simple 3D scaling.

In U.S. Pat. No. 5,441,907 "Process for manufacturing a plug-diode mask ROM", H-C. Sung and L. Chen discloses a passive matrix addressed ROM where binary data are coded at each matrix crossing point by the presence or absence of a diode connection. However, methods describing fabrication of devices according to the referred patent involve several high temperature steps, include final annealing, which precludes construction of multilayers and the use of low-cost, low temperature compatible materials.

Thin Film ROM Devices

In GB Patent 2,066.566 "Amorphous diode and ROM or EEPROM device utilizing same", S. H. Holmberg and R. A. Flasck discloses thin film memory devices based on fluorine-containing amorphous silicon. In U.S. Pat. No. 5,272,370 "Thin-film ROM devices and their manufacture", I. D. French discloses a ROM device based on thin-film memory cells in a passive matrix addressing arrangement. Emphasis is explicitly on multilevel (i.e. multi-bit) data storage in each memory cell, by providing multilayer structures that can be individually selected for each memory cell.

It is a main object of the present invention to provide architectures and technical solutions where dense bit cell patterns in 2D can be incorporated into 3D storage structures, employing easily implementable, low-cost manufacturing technologies.

It is a further object of the present invention to provide ROM, WORM, and REWRITABLE memory devices with short random access times, high data transfer rates and low power consumption. In the present document, the term "REWRITABLE" shall be used in connection with memory cells where information that has been stored can be exchanged by new information through an erase/write or direct overwrite operation. Depending on the application, this operation may be performed only once, or repeatedly.

It is yet a further object of the present invention to provide integrated data storage and processing devices where memory structures and device architectures can be created in very dense structures characterized by short, highly parallelized interconnection paths in two and three dimensions.

Finally, it is also an object of the invention to provide a fabrication method for a data storage and data-processing apparatus based on low-temperature compatible processes and materials suited therefor.

The above-mentioned objects and advantages are realized by one or more embodiments of the present invention. The objects of the present invention are particularly achieved by exploiting novel materials and processes that make possible the creation of devices with new architectures in two and three dimensions. Salient features in that connection are:

1) Memory modules are made by low-temperature compatible processes and materials i.e. polymers or low temperature processing of poly- or micro- or amorphous silicon. Low-temperature compatible in this context refers to processes not exceeding static temperatures compatible with polymer-like substrates, or transient heating processes limited to times sufficiently short to be similarly compatible. As an example: In laser crystallization of thin film silicon, the temperature in the outermost layer is in fact quite high, but due to the short thermal pulse and total energy density, heat redistributes quickly into supporting layers. Beyond a certain depth, the latter do not reach high temperatures due to calorimetric effects. For simplicity, low temperature compatible processes and materials as described above may be referred to in the following as "low temperature processing" and "low temperature materials".

2) Low temperature processing makes possible the creation of memory modules in one superlayer or a stack of superlayers without damaging underlying circuitry nor other memory layers in the stack. This applies both to devices based on traditional single crystal silicon substrates, as well as plastic substrates with thin-film active circuitry. (In the latter case, the short duration of the heat pulse typically used in laser recrystallization appears to prevent damage to the plastic even at temperatures where a sustained thermal load would cause damage).

3) From 1) and 2) follow a number of beneficial consequences:

Possibility of stacked layers. Leads to:
High volumetric data density, and:
High density, short vertical interconnects, leading to high data throughput:

Low capacitive and resistive interconnects due to short distance high degree of parallelism (many vertical connections) for large word widths.

Exploiting areas in sublayer single crystal or high performance polycrystalline, amorphous or microcrystalline layer underneath memory modules for tasks requiring high-speed active circuitry. Examples:

Integrated SRAM data cache

Driver and interface electronics

On-board error detection and correction block-oriented circuitry to increase reliability of memory layers High area data density in each layer due to the passive matrix addressing, with the option of locating driver circuitry layers below and/or above as well as in the same layer.

Vertical interconnections can take many forms: One is penetrating conductors through vias, in which case the short distances and large areas available in the stacked concept permit high data transfer speeds as mentioned above as well as flexible architectures, involving, e.g. staggered arrangement of vias as described in more detail in connection with a preferred embodiment below. Vertical interconnections can also be achieved by electrical conductors in each layer leading to the edge of the layer in question, where they are exposed and can be electrically connected to similarly exposed conductors in other layers. This may e.g. be facilitated by a step-wise extension of the edges of the lower-lying layers. Another class of vertical interconnections relies on contact-less (non-galvanic) communication through the layers. This is possible due to the layered architectures, i.e. capacitive, inductive or optical coupling between circuits in different layers.

A preferred design according to the invention is realized as a layered structure built on a single crystal silicon substrate which contains all active electronic circuitry. The latter communicates with one or more overlying memory layers through vias. Each memory layer contains low-temperature processed diode ROM and/or WORM and/or REWRITABLE arrays where high areal bit density is achieved through the use of passive matrix addressing. Each memory layer constitutes a self-contained entity and requires no high-temperature or chemically aggressive processing that can damage the underlying structures during manufacture. Thus, the memory modules can be positioned on top of active electronic circuitry in the substrate, conserving substrate real estate and providing short electronic pathways between the active circuitry and the memory modules. Furthermore, memory capacity can be expanded by adding more memory layers on top of the first, leading to a 3D stacked structure with very high volumetric bit density.

Devices as described above lend themselves well to "back-end" processing of the memory modules, where all circuitry on the single crystal silicon substrate is first prepared using traditional silicon foundry processing. The subsequent deposition of the memory layer(s) may be performed in a separate facility, e.g. if it is desirable to employ materials and processes in this step which might represent a contamination problem for the silicon processing.

The driver and sense circuits are preferably fabricated in a standard CMOS process on single crystal silicon substrate to minimize costs and to achieve required high data transfer rates. The ROM/WORM/REWRITABLE arrays are then built above the final metallization layer coupled by vias to the underlying drivers. The diodes can be inorganic, e.g. amorphous, polycrystalline or microcrystalline silicon, or they can be based on an organic material such as a conjugated polymer or oligomer. The passive matrix addressing scheme and the 3D architecture employing the low temperature diodes provide a dramatic storage enhancement over all existing ROM/WORM/REWRITABLE designs, at only marginal cost above the underlying CMOS circuit.

For clarity and concreteness, a detailed description of the invention shall be given below in terms of a preferred embodiment based on low-temperature processed poly-Si diode ROM arrays in a stack with four double-layer. The design can be easily extended for WORM memories applications utilizing either induced explosive crystallization of amorphous diodes or conductance modulation of interlayer organic films, and to REWRITABLE memories by incorporating highly functional memory materials in the memory matrices; cf. other patent applications belonging to the present applicant, quoted in the present document.

BRIEF DESCRIPTION OF THE DRAWINGS

The following detailed description refers to the appended drawing figures, of which

DETAILED DESCRIPTION

Figure 1:
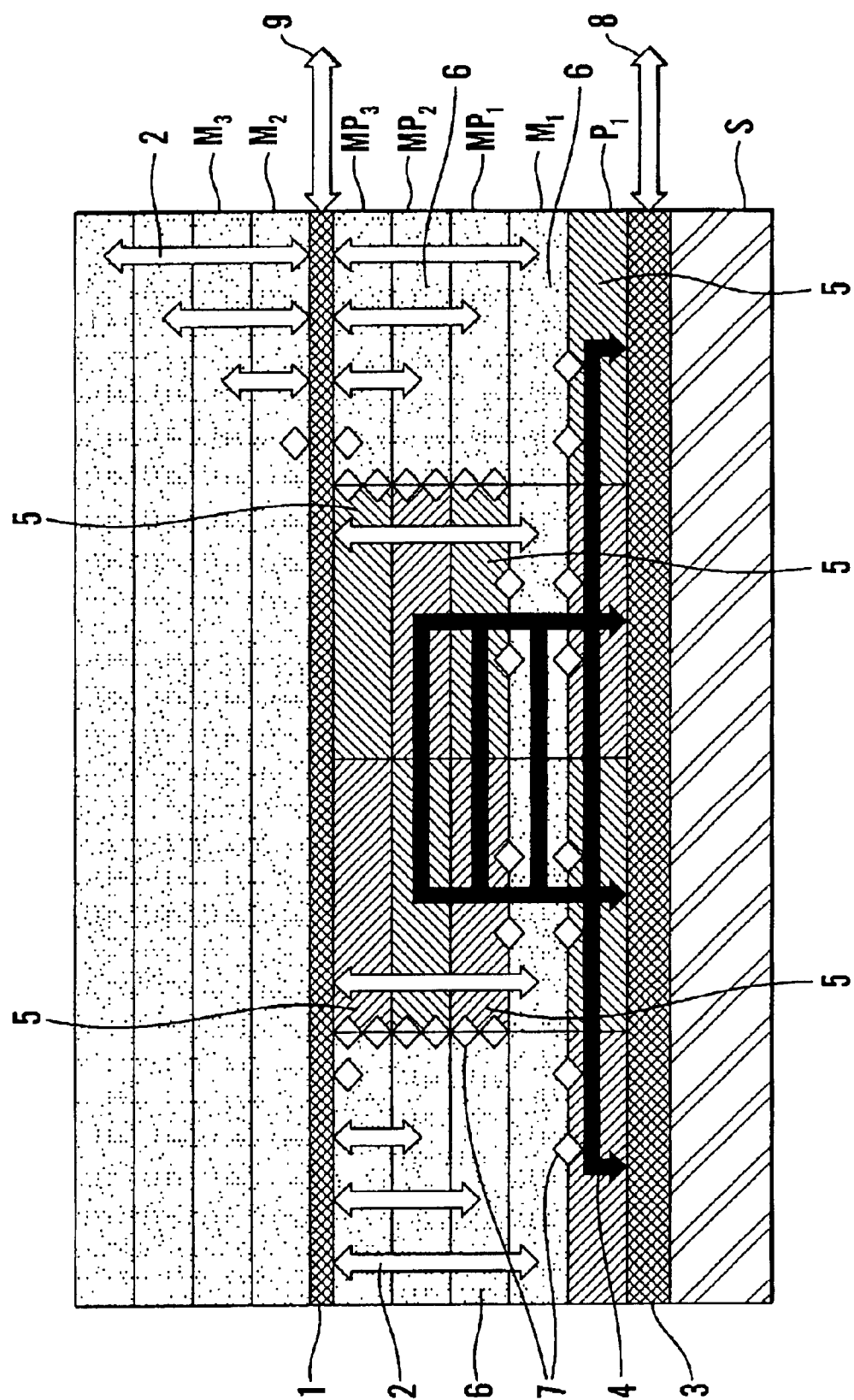
FIG. 1 shows an embodiment of a scalable integrated data-processing device to which the present invention may be applied, FIG. 2 the schematic layout for a 1 GB ROM apparatus according to an embodiment of the present invention, FIG. 3 the layout of the row/column addressing lines of a pair of memory planes of the ROM in FIG. 2, FIG. 4 a staggered stacking arrangement of memory planes of the ROM in FIG. 2, FIG. 5 a combination of several staggered stacking arrangements of the kind shown in FIG. 4 into a multisegmented staggered stacking arrangement of the memory planes of the ROM in FIG. 2, FIG. 6 staggered vertical or horizontal vias for connecting through or across memory planes and connecting the latter to underlying circuitry, FIG. 7 a graph of the access time versus the number of memory block segments, FIG. 8 a graph of the average addressing power requirement versus the average block (read) addressing size, FIG. 9 vertical diodes in "on" and "off" memory element in a ROM, and FIG. 10 vertical diodes as in FIG. 9, but fabricated by a self-aligning and -planarizing process.
Figure 2:
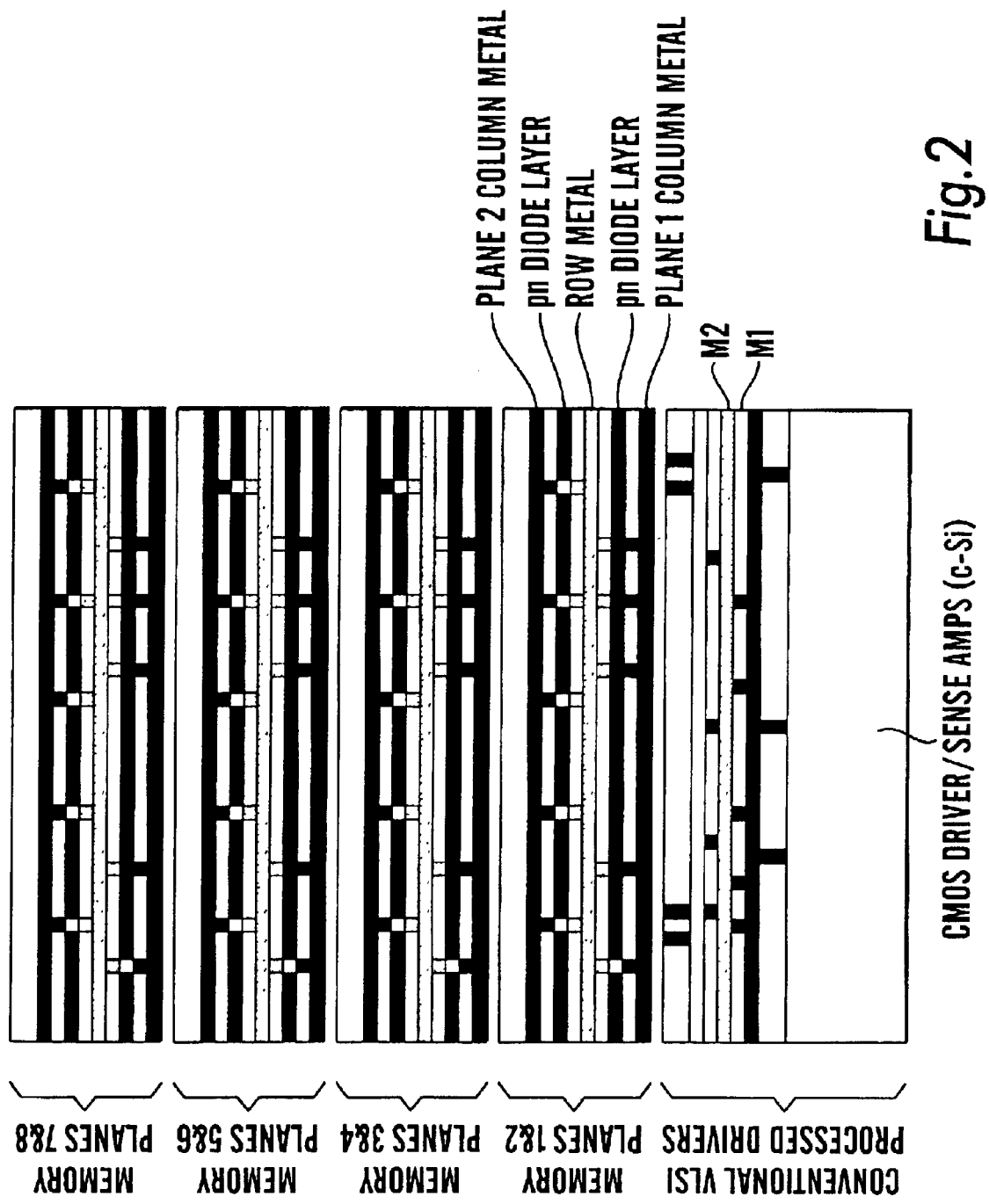

The schematic layer layout for a 1 gigabyte (GB) apparatus according to an embodiment of the invention is shown in FIG. 2. Row demultiplexers and drivers, sense amplifiers, and column multiplexers are implemented in a conventional VLSI COMO single crystal chip forming the base of the structure. All of the diode-ROM layers are fabricated after completion of the VLSI circuitry above a final dielectric deposition and CMP planarization.

The details of the VLSI CMOS circuitry will not be discussed except as it specifically relates to the memory planes. The drivers and sense amplifiers are essentially identical to those used in conventional DRAM modules and the designs can be lifted almost intact. Row driver inverters will have to be resized to accommodate the high capacitance of the diode-ROM configuration, and the sense amplifiers will need to be modified for slower charging rates.

The memory planes are stacked layerwise and each ROM layer includes simple row/column line crossing linked potentially by a vertical diode structure; a binary 0 (or 1) indicated by the presence of the diode. A total of eight memory planes, each incorporating $10^9$ bits, are required to yield the gigabyte module. To reduce the total number of mask levels, row lines are shared between two memory planes—reducing the speed, but simplifying the overall fabrication.

Figure 3:
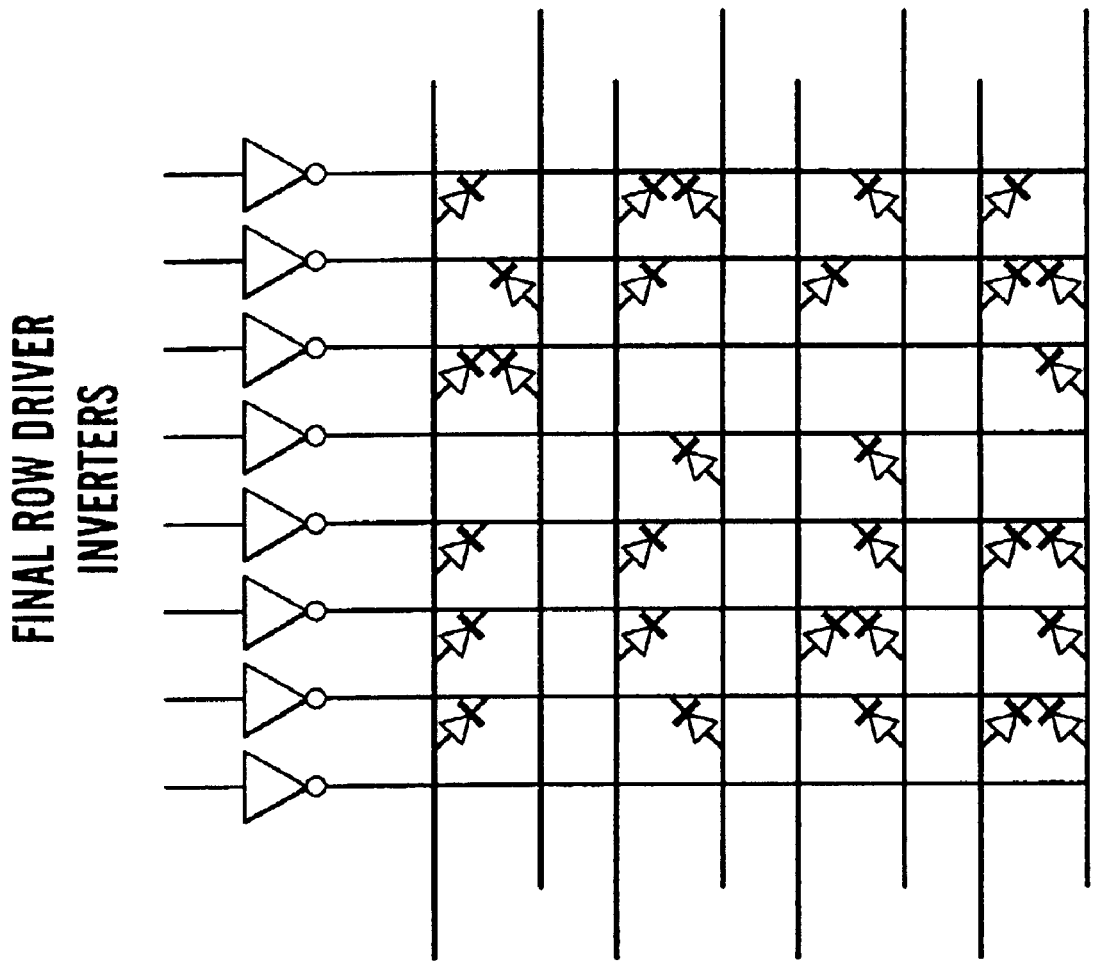

The electrical schematic for each pair of memory planes is shown in FIG. 3. Once a row address is latched (RAS), a final inverter drives one row line to ground. Current flows through the diodes from the column lines (symmetrically from both column pairs) and the voltage drop on the column line in sense in parallel for all column lines. Following read, the row line is returned to $V_{DD}$ potential and the column lines to their quiescent potential (between ground and $V_{DD}$- 0.7). The power and speed penalty for the diode defined memory (compared to a NOR MOS design) is more than offset by the density increase permitted by a row/column dense metal crossing layout. In a block-oriented data access device, driving a single row inverter provides data readout for two columns. Although the speed of each row access may be limited by capacitive charging, the total data transfer rate is "amplified" by twice the column length. As discussed further below, the random data access time can also be adjusted by appropriate segmentation of the memory, something which shall be discussed in more detail below with reference to FIG. 5.

Figure 4:
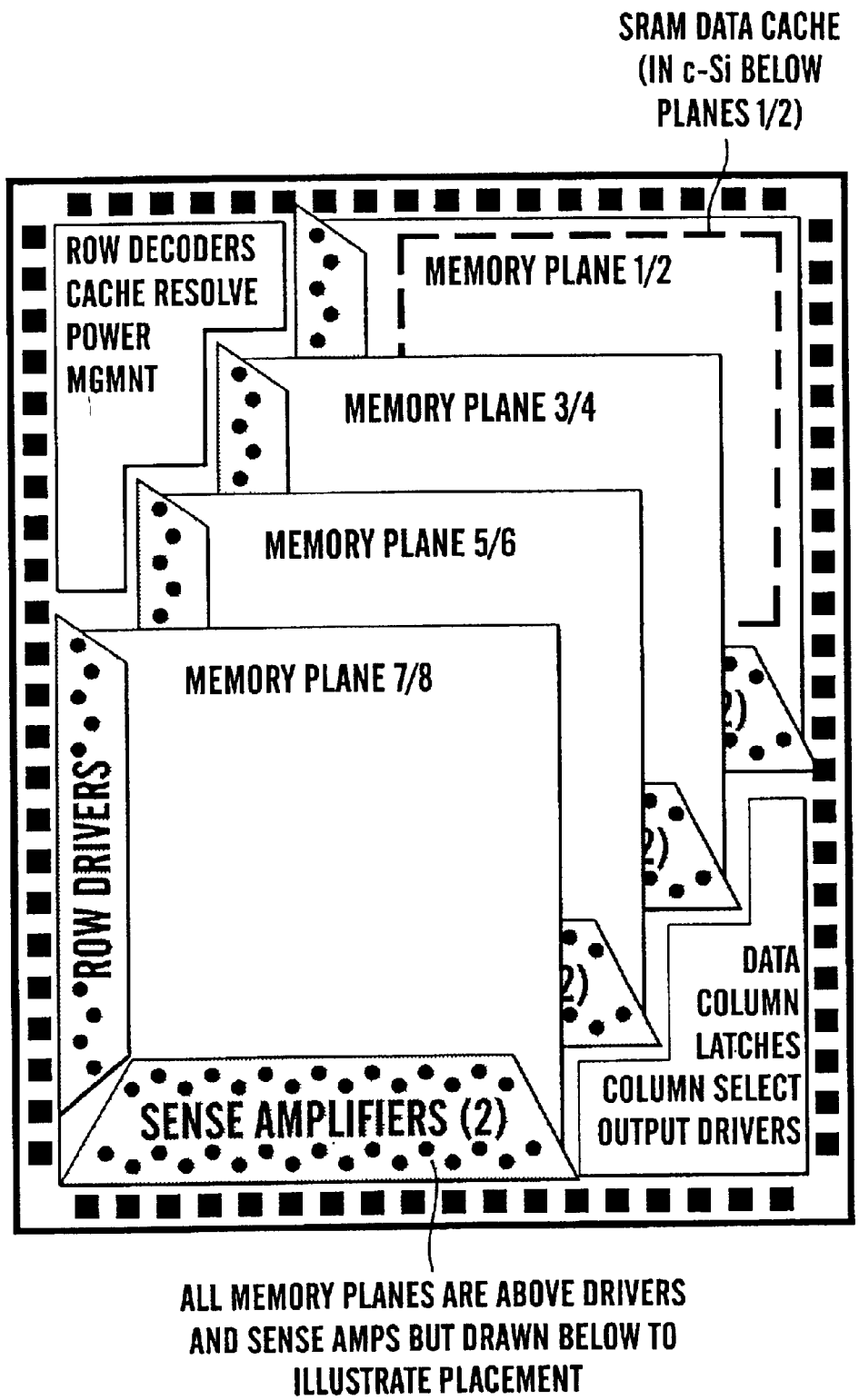

Independent of the segmentation, the 3D memory layering requires staggered stacking of the memory planes on the Si die to provide area for the row drivers, sense amplifiers, and peripherial circuitry. This staggered stacking arrangement is shown in FIG. 4 wherein the memory planes are indicated by the light grey with single-crystal Si blocks defined by darker grey. Each memory plane pairs is offset both horizontally and vertically to provide single-crystal silicon real estate for the row drivers (large inverters) and sense amplifiers. All of the row drivers are fed from a common row decoder (NANDed with the final plane pair select) logic. The drawing is not to scale; in particular the fraction of the area required for row drivers and sense amplifiers decreases roughly as the square root of the memory size. Sense amplifiers, assuming even a segmentation of 4096×4096 will occupy less than 10% of the die real-estate. For 256 Mbit arrays, this area is less than one percent of the total die.

In the stacked design with memory arrays above the single crystal logic, a significant fraction of the die remains unused. Some fraction of this is required for bad-cell mapping and error-correction logic, but the remainder is preferred to be implemented as a SRAM data cache to reduce multiple accesses to the memory planes. As considered below, the primary power dissipation occurs during memory access—reducing the number required by resolving requests from cache has the potential to dramatically reduce the overall power even in a random-access mode. For random memory access, the cache would need to still provide some sort of look-ahead predictive reads from memory to compensate for power and speed limitations on direct access. For highly block-oriented memory applications, the cache becomes less critical and the area could instead be devoted to higher order error correction algorithms to improve die yield and reduce costs.

Figure 5:
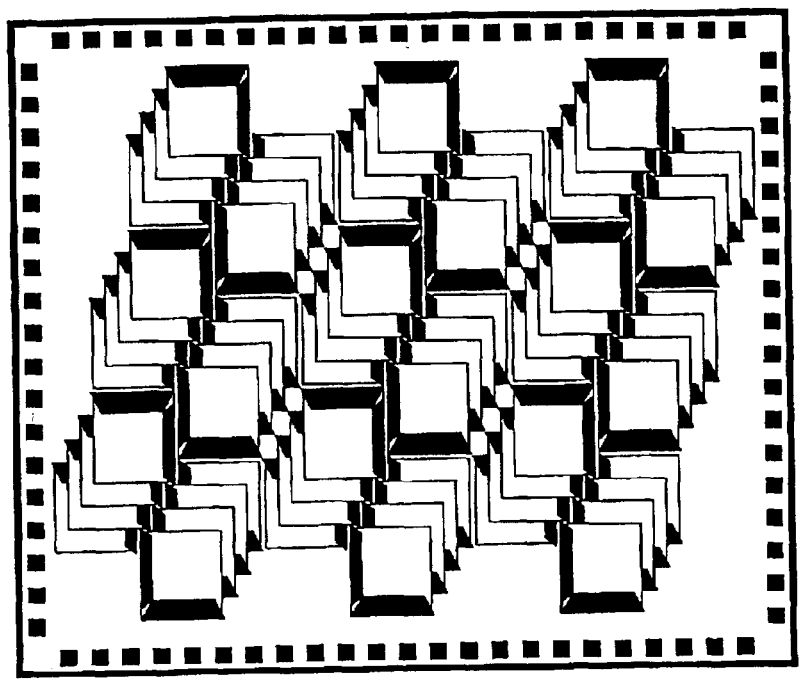

Because of the capacitive loading from the diode elements, the optimal memory structure of an 8-plane. 1 Gbit/plane, will not be 32.768×32.768 arrays. Both the row line capacitance (from dielectric and diode elements) and the column line capacitance increase linearly with the array size. The row charge and diode current transfer set the power dissipation; the column capacitance directly determines the charge integration time required for the sense amplifiers. To increase speed, the 1 Gbit memory blocks could be segmented as shown in FIG. 5, wherein the stacked arrangement in FIG. 4 is used for combining several such planes alternating the sense of stacking between the separable blocks—at the cost of increased driver electronics real-estate. But since large areas of the Si substrate are unused in this design (remainder dedicated to cache), this cost is not significant. The optimum segmentation depends strongly on the application—in particular the averge size of the memory block accesses. In general, smaller segments are essential, for power dissipation reasons, as the block size drops. Minimum random access speed can also be dramatically improved by increasing the number of memory segments. (Both of these issues are considered further below.)

It is also possible to implement the multiple array blocks using only a single pair of sense amplifiers using common column vias with diode isolation between the planes. However, there is a severe speed penalty in this design due to the time required to turn-on the isolation diode for the planes. In the futures when active MOS isolation transistors are viable on the memory planes single sense amplifier designs can be utilized for some applications. But the die size gains are minimal since the underlying substrate is not real-estate limited.

To achieve required data transfer rates, all of the sense amplifiers must be latched during data strobe providing a block transfer to the column decode logic. This would naturally occur within a SRAM cache as part of the design. Assuming a CD-ROM based replacement, the majority of data accesses will be resolved from the column latch cache without additional row data strobes.

Figure 6:
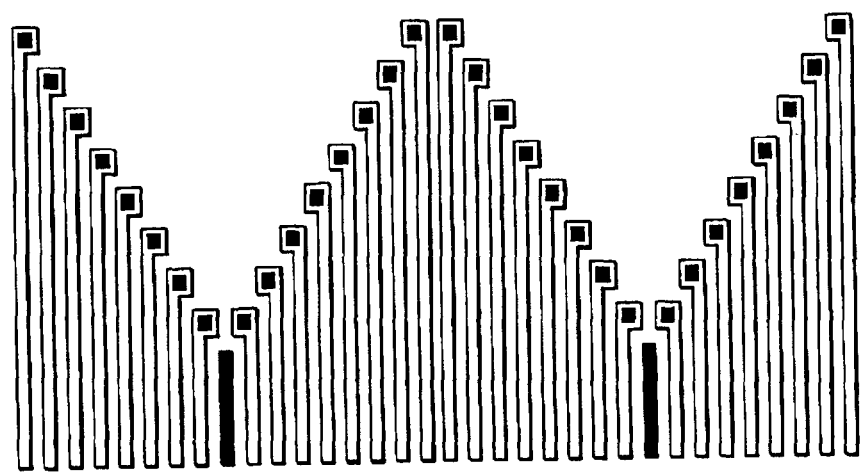

Limitations arising from dense vias between device level and the upper memory blocks could be of concern, but this is not the case since the vias can be staggered satisfying both design rules for conventional via attach and achieving dense metal wiring density for the memory arrays. Simple staggering of the vias, as shown in FIG. 6, illustrates one possible solution. Vias are staggered up (or across) the die to rigorously satisfy the 2×2λ via size, 1λ metal overlap on all sides of the via. 3λ minimum via spacing, yet maintaining wiring at full dense metal within the memory array itself. The vias will generally be separated further than illustrated to accommodate the actual required space of the sense amplifier or row drivers. In this layout, one line in N is lost. To maintain uniform metal density and optimize process development (necessary to push metal pitch beyond random logic design rules), the missing line is replaced with a dummy metal line (no connection). The reduced row/column density arising from this stagger approach is incorporated in calculation results given in the design analysis below. Although illustrated for a 2λ via, the extension to an arbitrary size via for connecting memory arrays to Metal 1 or 2 is obvious.

With the general layout defined as above, the required die size can now be determined. The memory plane density is limited by memory metal wiring pitch and sets the overall density of the memory. A conservative design requires metal pitch based on both minimum via overlap and metal-to-metal spacing. The overall die size will then be roughly 20% larger than the memory plane itself (for staggered layout and peripherial drivers). However, it is not necessary to limit metal to random logic design limitations. By moving to a full dense metal array with uniform spacing and density, the line width and spacing can be reduced considerably. As long as random wiring is minimized on the memory planes, lithography and etching can be specifically optimized to the dense metal pitch allowing use of poly or metal 1 line widths even in these upper layers. This cannot apply to the vias—but as shown above these are fabricated well within the design rule limits.

In addition, the simple design of the memory cell does not require via metal overlap within the memory cell; lithography misalignments may reduce the contact area (one axis), but the subsequent interlayer dielectric will passivate the exposed diode component. These two process modifications allow the maximum metal pitch resulting in the $4\lambda^2$ cell areas (where $\lambda$ is approximately the metal width/spacing).

Table 1 fully compares three technologies based on 0.35, 0.25, and 0.18 $\mu$m lithography (design rules taken from both TSMC and MOSIS scalable designs). The table below summarizes results for a 1 GB design assuming 512 byte average block transfers and a design requirement for 1000 MB/s total data transfer. The segmentation is the recommended size to balance access times, with a 100 ns maximum requirement.

TABLE 1

|  | 0.35 $\mu$m | 0.25 $\mu$m | 0.18 $\mu$m |
|---|---|---|---|
| Via size/spacing | 0.50/0.45 | 0.36/0.38 | 0.24/0.28 |
| Metal width/spacing | 0.60/0.50 | 0.40/0.40 | 0.28/0.28 |
| Metal via overlap | 0.20 | 0.15 | 0.10 |
| Dense metal (cells) width | 0.40 | 0.30 | 0.24 |
| Dense metal (cells) spacing | 0.40 | 0.30 | 0.24 |
| Minimum cell size | 0.8 × 0.8 $\mu$m | 0.6 × 0.6 $\mu$m | 0.48 × 0.48 $\mu$m |
| Cell area | 0.64 $\mu$m$^2$ | 0.36 $\mu$m$^2$ | 0.23 $\mu$m$^2$ |
| Memory Density/Layer | 0.156 Gb/cm$^2$ | 0.278 Gb/cm$^2$ | 0.435 Gb/cm$^2$ |
| Optimal Segmentation (#) | 16 | 4 | 4 |
| Die area | 742 mm$^2$ | 402 mm$^2$ | 257 mm$^2$ |
| Random Access Time | 52 ns | 76 ns | 68 ns |
| Power dissipation (array) | 25 mW | 22 mW | 9 mW |

It is thus feasible to implement a 1 GB memory in existing 0.25 $\mu$m technologies—with a die size well within reasonable constraints (<500 mm$^2$). For 0.35 $\mu$m design rules, the single chip die size is probably too large to be manufacturable, but a 0.5 GB array is within reason. The only caveat on 0.35 $\mu$m technology is that the upper level metal planarization must be implemented as a CMP process to provide the planarity required for dense metal on upper layers.

Memory speed and power dissipation shall now be considered in relation to design and operating parameters.

Design parameters: For the purposes of this design example, the following approximations were used:
  Row and column line parasitic capacitances will taken as equal to the direct capacitance
  Interlayer dielectric is 300 nm of SiO$_2$ equivalent
  Metal line conductivities are 0.07 $\Omega$/☐
  Sense amplifier minimum threshold is 10 mV
  Diode transconductance is 10$^3$ A/cm$^2$ for a 1 V forward bias
  Diodes are one-sided junction with 400 nm depletion width at zero bias (10$^{17}$ doping)

Data Transfer Rate

The desired 1 Gbit/s sustained data transfer rate is easily achieved once the column latches are filled. Even in a 4096 segmentation, each row access satisfies 8192 latches requiring row read times of only 10 $\mu$s, whereas actual data access times are sub 1 $\mu$s. However, this assumes the data transfer is highly correlated and all 8192 column bits are useful. The penalty arises in power as this is violated.

Access Time

The instantaneous data access speed (time from RAS to data available on CAS latches) is determined by the charge time through the diodes to the column line capacitance. This will be the more difficult parameter to achieve within a diode-based ROM cell. The time is a complex function of the array size (segmentation), diode conductance, diode capacitance (major), row drive line resistance and sense amplifier minimum voltage sensitivity.

The access time is the sum of the row charge time ($R_{row}C_{row}$), the column sense integration time to the minimum specified voltage swing ($C_{col}\Delta V/1_{diode}$), and an estimate of random logic delays for row/column addressing.

Figure 7:
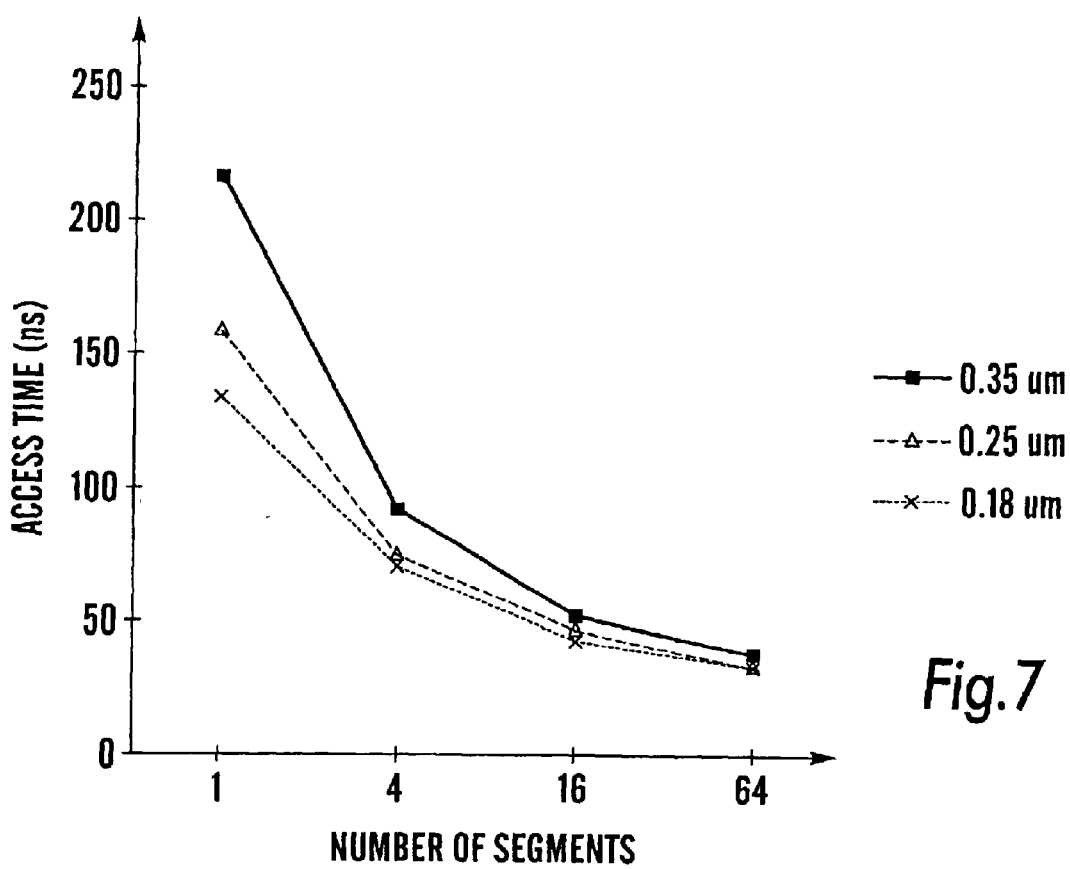

As evinced by the graph of FIG. 7, the access speed is only slightly dependent on the lithography rules, but strongly depends on the segmentation size. There are decreasing returns above 16 segments for the array.

Power Dissipation

Figure 8:
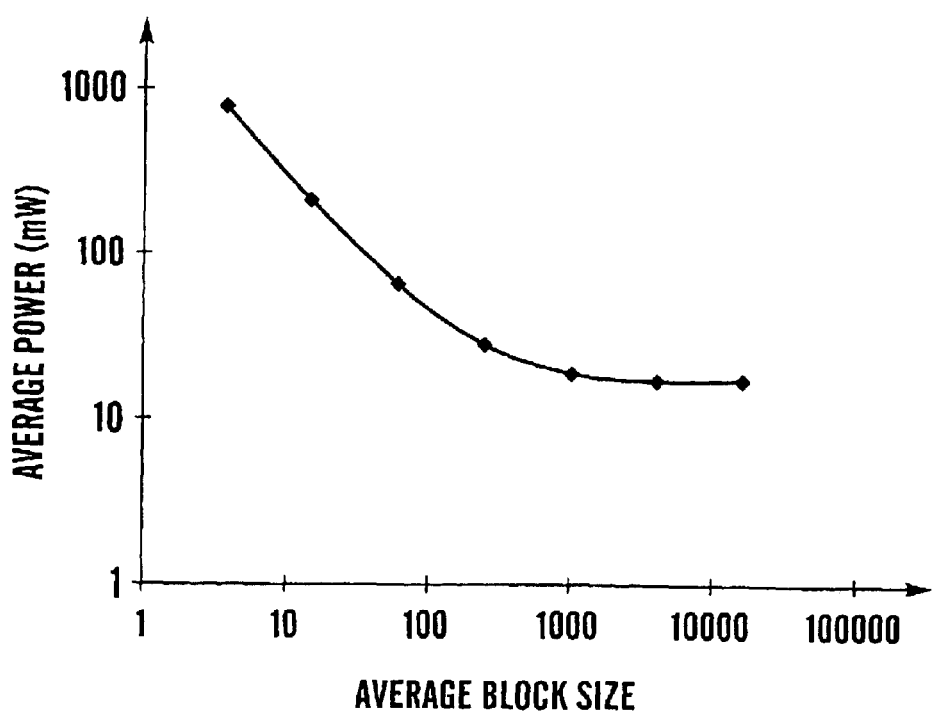

The primary design parameter influencing the power dissipation is the average size of the block transferred in each read. As long as the read request can be resolved out of the row read cache, the power required for charge and sense amplifiers can be averaged over a large number of read cycles. But if the access becomes random requiring a row charge cycle for every access, the power requirement will grow substantially. The graph of FIG. 8 illustrates the estimated power requirement as a function of the average block read size with a sustained data transfer rate of 1000 GB/s. For this purpose, the four-segmented 0.25 $\mu$m design was used. Note that the scale are logarithmic. As long as the average block size remains above a few hundred, the power dissipation is determined by the intrinsic transfers. As the size drops though, additional row reads are required and the power rises inversely with the block size.

Memory Plane Fabrication

The multiple plane implementation of an e.g. ROM memory according to the present invention requires that upper level processing retain planar structures with minimal topography growth (over 12 metal layers). Processing must be consistent with metal line exposure on row/column vias—effectively limiting processing to <250° C. Preferably, the fabrication of the diodes shall also be self-aligning with the contact vias to reduce mask count.

Two feasible routes shall now be discussed, based on inorganic semiconducting materials:
  microcrystalline Si selectively deposited on a metal/Si seed layer through vias (or blanket deposition and CMP etch).
  explosive crystallization of blanket a-Si—leaving high resistivity a-Si for planarization—using laser intensity modulation with the via dielectric.

Figure 9:
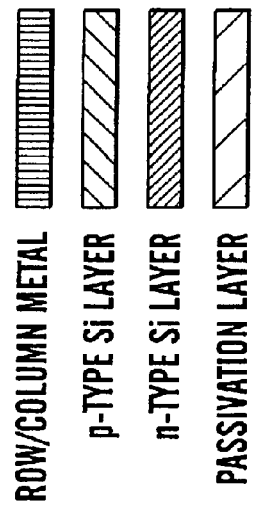
Figure 9:
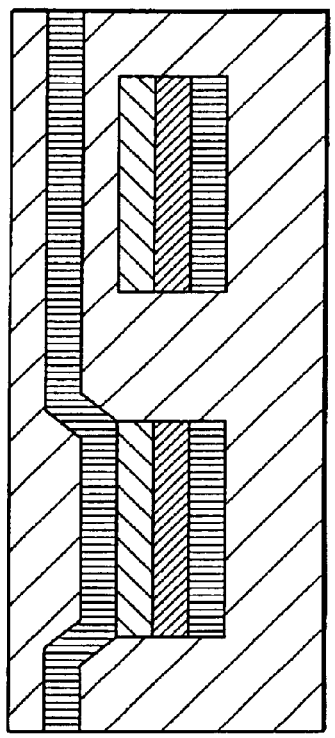

Memory density at 4 f$^2$ requires the isolation diodes to be fully processed and contacted in a vertical configuration—in contrast to the traditional planar configuration present in today's technology. The isolation diodes in either a ROM or impedance controlled RAM devices are fabricated directly on the row/column metal as indicated in FIG. 9. The memory cell on the left, for a ROM, is "on" while the memory cell on the right remains off. In the simplest configuration, the only difference between memory cells is the presence or absence of a cut in the interlayer dielectric patterned over the diode material. Several specific fabrication technologies will be discussed, beginning from the most complex using present manufacturing technology to those involving only more esoteric processes.

The fabrication of vertical diodes by directed energy processing shall now be discussed with reference to specific processing examples.

Example A

Fabricating Diodes Directly on Metallization with Polymer/low Temperature Substrates Common to all fabrication strategies is the formation of a p-n junction diode in the vertical orientation directly on the dense metal line array forming the row or column lines of the memory. Transient thermal processing, specifically pulsed laser or ion beam, is the preferred method for fabrication as it is compatible with other low temperature materials for WORM/RAM applications. The method involves:

i. Deposition of metal film for row/column underlying matrix. The choice of the underlying metal depends in part on the method below, as discussed further below. The metal film may be a multilayer consisting of a highly conductive underlayer (Al) and an interface barrier for contact with the Si (eg. tungsten).

ii. Deposition of thin amorphous donor (n-type) doped silicon by, for example, sputtering, e-beam evaporation or PECVD.

iii. Deposition of a second layer, in-situ, of acceptor (p-type) doped silicon or germanium.

iv. Laser-induced crystallization of the amorphous films forming polycrystalline pn junction diodes. The energy density is chosen to achieve full or nearly full melt of the silicon film resulting in nucleation from the metal layer. This will result in large grain (>50 nm) polycrystalline diodes with the junction near the original p-n deposition boundary.

v. Mask and etch of the lower level row lines, followed by conformal deposition of interlayer dielectric ($SiO_2$).

vi. Patterning of contact level defining "on" and "off" memory cells.

vii. Column metal deposition and pattern/etch.

Example B

Modification to Utilize Explosive Crystallization

The fluence required for crystallization in (iv) above is determined by the film thickness. The crystallization may alternatively be done using the explosive crystallization (M. O. Thompson, Phys. Rev. Lett. 52:2360 (1984) method requiring only the formation of a minimal surface melt. The enthalpy difference between the amorphous and crystal phases will drive the melt through the film with minimal net thermal impact on the lower metal layer. The resulting diode layer is a mixed amorphous/polycrystalline phase but retains sufficient current density (100 $A/cm^2$) for memory isolation applications.

Example C

Modification to Use Schottky Diodes

Instead of deposition p and n films for a junction diode, the process may be modified to fabricate Schottky barrier diodes directly with the lower metal film. This modification involves the deposition of only an n-type film, crystallization and formation of a Schottky barrier with either the direct metal (minimal liquid interaction) or with a silicide phase formed iva partial melting of the metal contact. This modification is most appropriate with explosive crystallization to minimize the thermal energy dissipated in the metal layer.

Example D

Modification to Auto-dope from the Metal Contact

Electrically active dopants can be incorporated into the metal film eliminating the need for separate films of n and p type Si (steps ii and iii above). A thin coating of arsenic or boron on a tungsten metallization, or an alloy containing boron or arsenic, can provide compensating doping to a single film deposition. The partial melting and incorporation of the impurities from the metal or metal overcoat, followed by liquid-phase diffusion and potentially segregation during crystallization, will form a p-n junction as well. The position of the interface is controlled by the crystallization dynamics and can be controlled by fluence modification, again primarily in the explosive crystallization regime.

Example E

Modification to Use Germanium

All of the above methods work equally well with germanium as for silicon. Although germanium polycrystalline diodes may show higher leakage, this is offset by the 450 K reduction in all of the liquid process temperatures. Although transient, the molten phase is nevertheless extremely reactive.

Example F

Metal Selection

Aside from the modification disclosed as example C above, the primary requirement for the metal is to minimize interactions with the molten semiconductor during solidification. Candidate metals then include the refractory metals such as tantalum, tungsten, and platinum, mid-transition metals including Pd, Mo, Ni, Co or Cr, current diffusion barriers such as TiN, and terminal silicide phases such as $NiSi_2$. All of elemental metals form stable silicide phases and moderate reaction is expected with the liquid Si or Ge. Use of a stable silicide would minimize such reactions; however, since the silicides are adequate conductors as well, formation of a thin silicide is generally not a problem. Formation of a well-defined silicide is required for implementation of the modification given as example C.

For self-alignment and planarization of the diodes certain processing may be introduced.

The process described in example A above is conventional semiconductor processing involving accurate overlay of the contact mask with underlying row metallization. In addition, the etch processes produce increasing rough topologies that must be planarized for stacked 3D integration. However, the $10^3$–$10^5$ difference in conductivity between polycrystalline and amorphous phase can be used to develop self-aligning diode definition patterns and simultaneously address planarization issues. The primary modification for this mode is to leave amorphous phase material in the inter-diode regions and minimize the feature heights. The process flow in this case would be:

i. Deposition and patterning of the metal for row lines. This would be fully etched and planarized with dielectric between metal lines.

ii. Uniform deposition of n and p amorphous films (or single layer via modifications discussed above).

iii. Deposition of contact dielectric plus thin metal reflector layer (Cr or Al). Pattern etched leaving vias where diodes are to be formed.

iv. Laser irradiation through the patterned film. Only in the vias will sufficient energy be absorbed to initiate crystallization of the silicon (explosive or full melt).

v. Metal deposition for the column lines. (The reflector film, if of compatible metal, need not be removed prior to deposition—it can be etched simultaneously). Column lines patterned and etched.

vi. Dielectric deposition and planarization.

Figure 10:
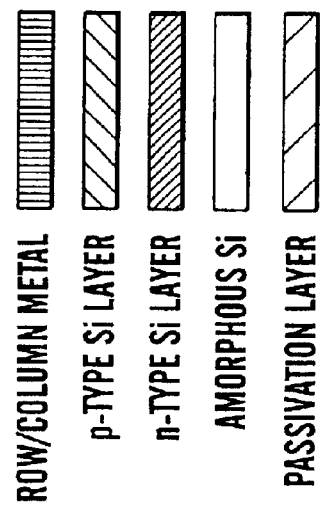
Figure 10:
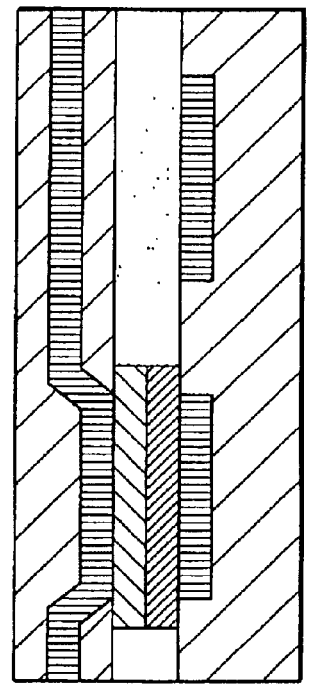

In this process, the alignment of column metal with alignment vias is relaxed. Misalignment cannot result in short-circuiting of column to row since the underlying metal is fully coated with amorphous silicon. The conductivity of the amorphous Si must be maintained sufficiently low that crosstalk between row lines is insignificant. This is easily achieved using very lightly doped a-Si films with the diode formed by incorporation of dopants from the underlying metallization (Example D above).—For the resulting diode structure, reference may be made to FIG. 10.

In another modification, a long wavelength laser is used to initiate crystallization rather than using a short wavelength (excimer laser) as the irradiation source. At 1.06 $\mu$m (the Nd:YAG wavelength), amorphous Si is sufficiently transparent that the energy can be transmitted through the amorphous film and absorbed only by the underlying metal film. This metal then initiates the explosive crystallization (or full melt). The advantage of this mode is that the diodes are formed only in the row metal region.

Finally the diode arrays can be patterned using a patterned laser beam (imaging through a mask) instead of using the on-wafer pattern. This is limited to larger feature sizes (1 $\mu$m) but eliminate several photolithography steps.

The present invention is by no means limited to ROM devices, but may be implemented as various kinds of memory and data processing apparatus and modules, as mentioned in the introduction. A brief discussion of alternative preferred embodiments shall now be given.

The basic architectures described above can also be adapted for WORM applications. This is achieved by starting out with passive matrix arrays where all crossing points exhibit rectifying diode behavior initially. Writing to a given crossing point is achieved by creating an open circuit, i.e. destroying the forward conductance of the diode.

In one class of embodiments, the matrix array is made by sandwiching a conjugated polymer between the two sets of parallel electrodes that constitute the passive matrix, with electrode and sandwich materials selected so as to create spontaneously a rectifying diode at each crossing point. The associated physics has been thoroughly investigated and described in the scientific literature. Writing to a given crossing point is achieved by one of several methods. The most straightforward one, but not the only one, is to create thermal damage by a short but intense current pulse through the polymer material at the crossing point, causing a spatially controlled reduction of the conductance, or an open circuit. Descriptions of suitable materials and geometries have been given in the following patent applications controlled by the present applicant: Norwegian patent applications NO972803 and NO973390 and applications derived therefrom.

While reading is performed at low bias in close analogy to the preferred embodiment discussed under Section 4 above, writing requires higher currents and a different pulsing protocol. Thus, the temporal profile of the energy dissipation at the crossing point must be closely controlled in order to obtain the required thermal history at the diode junction, as well as confining the region of current-induced impedance change (e.g.: thermal damage) to the crossing point being written. These aspects imply that the electronic complexity is higher for a WORM memory as compared to the ROM type, and this taken together with the higher current requirements during writing lead to somewhat lower bit densities. On the other hand, the all-electronic writing process implies that the foundry-based processing steps involved in manufacturing, e.g. masked ROMs are avoided.

As is readily apparent to a person skilled in the art, the basic architectures described above open up opportunities for integrating ROM, WORM and REWRITABLE arrays in a single device, either in the same layer or layers, or as separate ROM, WORM and REWRITABLE layers in a single stack. Among the many possibilities resulting from this, combining memory types of this kind, shall particularly be mentioned.

Yield Enhancement by Self-diagnostics

As part of the post-manufacturing testing and qualification procedures, a self-diagnosis program in the ROM is activated to identify faults in the memory. Results are stored in the WORM and linked to instructions derived from the ROM, causing faults in the memory device to be circumvented or corrected. This is implemented in a fashion which is transparent to the user, apart from a possible latency. In this manner, the manufacturing yield can be enhanced.

A direct extension of the above-mentioned devices which may or may not combine different types of memory is to include processing power into the 2- and 3-dimensional architectures. Thus, distributed processors (including but not limited to microprocessors) with fast and direct access to dedicated memories in close physical proximity shall provide provide speed and flexibility not attainable by processor/microprocessor architectures based on traditional silicon wafer technology. For a more thorough discussion of these and related themes, particularly integrated memory and processing structures in a scalable architecture, reference may be made to Norwegian patent application NO 982518, wherefrom the present application derives priority and the computer literature in general.

As is apparent, the present invention provides extension of the ideas and concrete embodiments in the above mentioned literature, through novel architectural solutions as well as through the use of materials and processes that facilitate implementation of high density 2- and 3-D structures.

What is claimed is:

1. A data storage and processing apparatus comprising:
ROM and/or WORM and/or REWRITABLE memory modules on a substrate; and/or
one or more processing modules on the substrate,
wherein the memory and/or processing modules are provided as a plurality of main layers formed vertically on top of the substrate, wherein each main layer of a memory module and/or processing module comprise functional sublayers, wherein the memory modules and/or processing modules in each main layer communicate through vias, surface or edge connections with other main layers and with circuitry provided on or in the substrate and wherein the apparatus comprises active components in the form of transistors and/or diodes for operating the apparatus, characterized in that at least some and at most all the transistors and/or diodes for operating the apparatus are provided on or in the substrate, and wherein each main layer comprises a combination of organic materials and inorganic materials.

2. Apparatus according to claim 1, characterized in that at least a portion of the substrate contains semiconducting materials in doped or undoped form provided in bulk or as thin film on a passive carrier, and where the semiconducting materials are selected from one or more of the following, viz. silicon, gallium arsenide and germanium in amorphous, polycrystalline, microcrystalline, bulk or process-defined single crystal form, or organic semiconducting materials including molecules, oligomers or polymers or combinations thereof.

3. Apparatus according to claim 1, characterized in that the circuitry provided on or in the substrate is realized by one or more of the following technologies, viz. CMOS, NMOS or PMOS.

4. Apparatus according to claim 1, characterized in that the circuitry provided on or in the substrate comprises one or more cache memories in the form of SRAM, DRAM and/or ferroelectric RAM (FERAM).

5. Apparatus according to claim 1, characterized in that it comprises thin-film circuitry.

6. Apparatus according to claim 1, characterized in that the circuitry provided on or in the substrate comprises processors for detection and correction on memory errors and defects.

7. Apparatus according to claim 1, characterized in that the circuitry provided on or in the substrate comprises processors for remapping defect memory regions in the overlying layers and/or the substrate.

8. Apparatus according to claim 1, characterized in that the circuitry provided on or in the substrate comprises processors for dynamically remapping the memory modules in order to optimize performance and lifetimes thereof.

9. A data storage and processing apparatus, comprising:
  a substrate including an active circuitry, wherein the active circuitry includes at least one of one or more transistors and one or more diodes for operating the apparatus; and
  a plurality of main layers above the substrate, wherein each main layer includes at least one of one or more memory modules and one or more processing modules;
  wherein:
    the memory and processing modules within each main layer communicate with memory and processing modules of other layers and with the active circuitry of the substrate through at least one of vias, surface connections, and edge connections of each main layer; and
    each main layer includes a stack of one or more functional sublayers, with each functional sublayer realizing one or more specific circuit functions, wherein each functional sublayer comprises a combination of low temperature-compatible organic thin-film materials and low temperature-compatible processed inorganic thin-film materials, and wherein each main layer includes a portion of the active circuitry.

10. The apparatus according to claim 9, wherein at least one of the main layers comprises memory modules with passive matrix-addressable memory elements defined in a memory material at crossings between electrodes of a first set of parallel electrodes provided on a surface of the memory material and a second set of parallel electrodes provided on an opposite surface of the memory material and in intersecting relationship with the first set of electrodes, the memory elements being realized as non-linear impedance elements at the crossings, and each memory element is provided with a logic value given by an electrical impedance.

11. The apparatus according to claim 10, wherein each non-linear impedance element is one of a rectifying diode and a thin-film transistor.

12. The apparatus according to claim 11, wherein the non-linear impedance elements are made of at least one of the following:
  at least one of silicon, gallium arsenide and germanium in at least one of the forms of amorphous, polycrystalline, microcrystalline, bulk, and process-defined single crystal; and
  organic semiconducting materials including at least one of molecules, oligomers, and polymers, and combinations thereof.

13. The apparatus according to claim 10, wherein at least one main layer comprises dual passive matrix-addressable memory modules in separate sublayers, one overlying and one underlying memory module sharing one set of row or column electrodes.

14. The apparatus according to claim 10, wherein a plurality of main layers is provided and wherein at least two of the main layers share at least one of common row and column drive electronics and share optional sense electronics connected therewith through common wires.

15. The apparatus according to claim 9, wherein a plurality of main layers is provided, wherein each main layer includes a plurality of memory modules, the memory modules being in the form of juxtaposed segments stacked on the top of other juxtaposed segments in the main layer to form two or more juxtaposed stacks on the substrate, and that a part of each segment in each stack is connected to a portion of the substrate and communicates electrically with the active circuitry provided thereon.

16. The apparatus according to claim 9, wherein a plurality of main layers is provided, wherein each main layer includes a plurality of memory modules, the memory modules being provided in the form of juxtaposed segments stacked on the top of other juxtaposed segments in the main layer in a staggered arrangement such that each memory module in the stack is provided staggered in relation to adjacent neighbor modules, and that a part of each segment in each stack is connected to a portion of the substrate and communicates electrically with the active circuitry provided thereon.

17. The apparatus according to claim 9, wherein a plurality of throughgoing electrical conductors or vias providing power and signal connections among the main layers and the substrate is distributed laterally in a staggered arrangement.

18. The apparatus according to claim 9, wherein each memory module is one of a ROM, a WORM, and a REWRITEABLE type.

19. The apparatus according to claim 18, wherein at least one memory is one of a masked ROM and a patterned ROM.

20. The apparatus according to claim 9, wherein at least one main layer includes memory modules of at least two of the ROM, WORM, and REWRITEABLE types.

21. The apparatus according to claim 9, wherein at least a portion of the substrate comprises circuitry which is electrically connected with one or more of the main layers.

22. The apparatus according to claim 21, wherein the active circuitry of the substrate is formed from one of doped and undoped semiconducting materials on a passive carrier in one of bulk and thin film form.

23. The apparatus of claim 21, wherein the semiconducting materials are selected from at least one of:
  at least one of silicon, gallium arsenide and germanium in at least one of the forms of amorphous, polycrystalline, microcrystalline, bulk, and process-defined single crystal; and organic semiconducting materials including at least one of molecules, oligomers, and polymers, and combinations thereof.

24. The apparatus according to claim 22, wherein the active circuitry is realized by one or more of CMOS, NMOS, and PMOS technologies.

25. The apparatus according to claim 22, wherein the active circuitry includes one or more cache memories in the form of at least one of SRAM, DRAM and ferroelectric RAM (FERAM).

26. The apparatus according to claim 22, wherein the active circuitry includes processors for detection and correction of errors and defects of the memory modules.

27. The apparatus according to claim 22, wherein the active circuitry includes processors for remapping defective memory modules.

28. The apparatus according to claim 22, wherein the active circuitry includes processors for dynamically remapping memory modules.

29. The apparatus according to claim 9, wherein the inorganic thin-film material is at least one of silicon, silicon compounds, metals, metal compounds, and any combination thereof.

30. The apparatus according to claim 9, wherein the active circuitry of the main layers is realized in thin-film technology.

31. A method for fabricating a data storage and processing apparatus including a substrate including an active circuitry, wherein the active circuitry includes at least one of one or more transistors and one or more diodes for operating the apparatus, and the apparatus also including one or more main layers above the substrate, wherein each main layer includes at least one of one or more memory modules and one or more processing modules, wherein the memory and processing modules within each main layer communicate with memory and processing modules of other layers and with the active circuitry of the substrate through at least one of vias, surface connections, and edge connections of each main layer; wherein each main layer includes a stack of one or more functional sublayers, with each functional sublayer realizing one or more specific circuit functions, wherein each function sublayer comprises a combination of low temperature-compatible organic thin-film materials and low temperature-compatible processes inorganic thin-film materials; and wherein each main layer includes a portion of the active circuitry, the method comprising:

depositing and processing the main layers and functional sublayers of each main layer thereof in successive steps, wherein:
the depositing step includes one or more of:
selecting from semiconductor materials among thin films of amorphous, polycrystalline or microcrystalline silicon or germanium, oxides, dielectric materials, metals or combinations thereof and depositing the layer of such material by one of sputtering, evaporation, chemical vapour deposition or plasma-assisted chemical vapour deposition, spin coating, and combinations thereof; and
selecting from polymer materials among molecular, oligomer, and polymer and depositing the layer of such material by one of solvent techniques, evaporation, sputtering, vacuum-based techniques, film transfer techniques, and combinations thereof; and
the processing step includes one or more of:
processing each deposited layer of semiconductor materials using one of photolithography, wet etching, dry etching, reactive ion etching, plasma etching, chemo-mechanical polishing, ion implantation, and combinations thereof; and
processing each deposited layer of polymer materials using transient heating with one of pulsed laser or particle beams for inducing crystallization of deposited amorphous films, grain refinement of deposited films, and incorporation and activation of dopants therein, wherein;
the deposited layer is processed under thermal conditions that avoid subjecting an already deposited and processed layer to a static temperature exceeding a temperature in a range of 150–450° C.; and
the deposited layer is processed under thermal conditions that avoid subjecting an already deposited and processed layer to dynamic temperatures exceeding a transient stability limit of the polymer materials, wherein the transient stability limit is defined as one of being less than 500° C. for not more than 10 ms and process-induced chemical damage.

32. The method according to claim 31, wherein fabricating a thin-film silicon-based circuitry and transistors is performed by a low-temperature compatible process using laser-induced crystallization and dopant activation of the thin-film transistors.

33. The method according to claim 31, wherein a memory module is realized as a matrix-addressable memory with isolation diodes, characterized by forming isolation diodes in one of vertical and planar configurations by depositing directly amorphous at least one of microcrystalline and polycrystallines n- and p-type silicon or germanium films and depositing directly semiconducting organic thin films of oligomer or polymer.

34. The method according to claim 31, wherein a memory module is realized as a matrix-addressable memory with isolation diodes, characterized by forming the isolation diodes by laser-induced melting and solidification of deposited n- and p-type amorphous or microcrystalline films of inorganic semiconducting material directly on underlying one or more low temperature-compatible layers.

35. The method according to claim 34, characterized by protecting the one or more underlying layers from reacting with molten semi conductor material during the laser-induced crystallization by providing a thin-film diffusion barrier.

36. The method according to claim 34, characterized by designing a reaction between a molten semiconductor material and the one or more underlying layers to form a stable electrical conducting compound.

37. The method according to claim 31, wherein a memory module is realized as a matrix-addressable memory with isolation diodes, characterized by:
forming the isolation diodes by laser-induced melting and solidification of deposited amorphous or microcrystalline inorganic film; and
forming a pn junction of the diodes with compensating doping, the pn junctions being realized either from one of a deposited layer on an underlying metallization and autodoping using alloying elements in a passive matrix metallization.

38. The method according to claim 31, wherein a memory module is realized as a matrix-addressable memory with isolation diodes, characterized by:
forming the isolation diodes by laser-induced melting and solidification of a deposited amorphous or microcrystalline inorganic film; and
forming a Schottky-barrier diode with one of an underlying metallization structure and a compound formed by a reaction with the underlying metallization structure.

39. The method according to claim 31, characterized by:
constraining the laser-induced crystallization within an explosive crystallization regime;
transient melting of the surface of the film;
forming self-propagating liquid film.

40. The method according to claim 31, characterized by forming isolating structures from high resistivity or anisotropic contact materials.

41. The method according to claim 40, characterized by inducing modification of the contact materials by one of chemical and thermal techniques to thereby realize both the isolation diode and the non-conductive interlayer dielectric.

42. The method according to claim 41, characterized by the chemically or thermally induced modification taking place respectively by autodoping of high-resistivity amorphous silicon and laser-induced crystallization of high resistivity amorphous silicon.

43. The method according to claim 31, wherein a memory module is realized as a matrix-addressable memory with isolation diodes, characterized by:
forming diodes in spatially limited regions, wherein the limited regions include intersections of the matrix and simultaneously providing lateral isolation between the diodes by using a self-aligned process;
limiting the formation of diode junctions to the spatially limited regions by one of laser-induced crystallization with modulation of absorbed laser energy by features of underlying layers or structures, laser-induced crystallization with modulation of absorbed laser energy by antireflective or reflective thin films, constraining nucleation during laser-induced crystallization to metal regions by controlling an interlayer dielectric surface, using underlying layers or structures as dopant sources for diode junction formation via explosive crystallization, and selective chemical or physical vapour deposition of amorphous or microcrystalline films effected by surface modification of an interlayer dielectric surface.

44. The method according to claim 31, characterized by separating the functional sublayers with planarized dielectric layers, wherein the dielectric layers are made of at least one of oligomer, polymer, and inorganic material.

45. The method according to claim 31, characterized by initiating the induced crystallization by directed energy sources other than lasers, including pulsed ion and electron beams.

46. A data storage and processing apparatus, comprising:
a substrate including an active circuitry, wherein the active circuitry includes at least one of one or more transistors and one or more diodes for operating the apparatus; and
one or more groups of memory planes, wherein each group includes a plurality of memory planes formed above the substrate, wherein for each group:
the plurality of memory planes are stacked,
a memory plane of the plurality is displaced in an X direction or Y direction or both in relation to another memory plane of the plurality, and
each memory plane of the plurality is configured to electrically communicate with the active circuitry of the substrate.

47. The apparatus according to claim 46, wherein:
the apparatus includes a plurality of groups of memory planes; and
each group is juxtaposed in relation to another group above the substrate.

48. The apparatus according to claim 47, wherein the memory planes electrically communicate with the active circuitry through at least one of vias, surface connections, and edge connections.

49. The apparatus according to claim 47, wherein the memory planes are formed from a combination of low temperature-compatible organic thin-film materials and low temperature-compatible processed inorganic thin-film materials, and wherein each main layer includes a portion of the active circuitry.

* * * * *